(12) United States Patent
You

(10) Patent No.: US 11,367,505 B2
(45) Date of Patent: Jun. 21, 2022

(54) STORAGE DEVICE, MEMORY DEVICE AND METHOD OF OPERATING THE MEMORY DEVICE

(71) Applicant: SK hynix Inc., Icheon-si (KR)

(72) Inventor: Byoung Sung You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/171,818

(22) Filed: Feb. 9, 2021

(65) Prior Publication Data

US 2022/0051745 A1 Feb. 17, 2022

(30) Foreign Application Priority Data

Aug. 12, 2020 (KR) .................... 10-2020-0101424

(51) Int. Cl.
| | | |
|---|---|---|
| *G11C 29/44* | (2006.01) | |
| *G11C 7/14* | (2006.01) | |
| *G11C 29/12* | (2006.01) | |
| *G11C 29/02* | (2006.01) | |

(52) U.S. Cl.
CPC ............ *G11C 29/4401* (2013.01); *G11C 7/14* (2013.01); *G11C 29/021* (2013.01); *G11C 29/12005* (2013.01)

(58) Field of Classification Search
CPC ..................................................... G11C 29/44
See application file for complete search history.

(56) References Cited

U.S. PATENT DOCUMENTS

| | | | | |
|---|---|---|---|---|
| 2014/0269055 A1* | 9/2014 | Kurosawa | ............... | G11C 16/26 365/185.03 |
| 2015/0029796 A1* | 1/2015 | Choi | ................... | G11C 11/5642 365/189.05 |
| 2016/0148703 A1* | 5/2016 | Kim | ....................... | G11C 16/26 365/185.11 |
| 2017/0117055 A1* | 4/2017 | Kim | ....................... | G11C 16/26 |

FOREIGN PATENT DOCUMENTS

| | | |
|---|---|---|
| KR | 1020120046868 A | 5/2012 |
| KR | 1020190084779 A | 7/2019 |

* cited by examiner

*Primary Examiner* — Muna A Techane
(74) *Attorney, Agent, or Firm* — William Park & Associates Ltd.

(57) ABSTRACT

The present technology relates to an electronic device. According to the present technology, a memory device having reduced latency includes a plurality of memory cells, an optimum read voltage information storage configured to store optimum read voltage information determined according to a cell count value, which is the number of memory cells read as a first memory cell based on data read from the plurality of memory cells among the plurality of memory cells, and a read voltage controller configured to calculate a cell count value corresponding to a default read voltage based on the data read from the plurality of memory cells using the default read voltage, in response to an optimum read voltage setting command input from a memory controller, and generate a first optimum read voltage based on the cell count value corresponding to the default read voltage and the optimum read voltage information.

22 Claims, 18 Drawing Sheets

FIG. 11

|  | Sel <1> | Sel <2> | Sel <3> | ... | Sel <i> |
|---|---|---|---|---|---|
| Read Retry | 3 | – | 2.0 | – | – |
| eBoost | 3.5 | – | 1.1 | – | – |
| Cell Count | 1 | 5 | 20 | – | – |

STORAGE DEVICE, MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0101424, filed on Aug. 12, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the same.

2. Related Art

A storage device is a device that stores data under control of a host device such as a computer or a smartphone. The storage device may include a memory device storing data and a memory controller controlling the memory device. The memory device may be classified into a volatile memory device and a non-volatile memory device.

The volatile memory device may be a device that stores data only when power is supplied and loses the stored data when the power supply is cut off. The volatile memory device may include a static random access memory (SRAM), a dynamic random access memory (DRAM), and the like.

The non-volatile memory device is a device that does not lose data even though power is cut off. The non-volatile memory device includes a read only memory (ROM), a programmable ROM (PROM), an electrically programmable ROM (EPROM), an electrically erasable and programmable ROM (EEPROM), a flash memory, and the like.

SUMMARY

A memory device according to an embodiment of the present disclosure may include a plurality of memory cells, an optimum read voltage information storage configured to store optimum read voltage information determined according to a cell count value, which is the number of memory cells read as a first memory cell based on data read from the plurality of memory cells among the plurality of memory cells, and a read voltage controller configured to calculate a cell count value corresponding to a default read voltage based on the data read from the plurality of memory cells using the default read voltage, in response to an optimum read voltage setting command input from a memory controller, and generate a first optimum read voltage based on the cell count value corresponding to the default read voltage and the optimum read voltage information.

A storage device according to an embodiment of the present disclosure may include a memory device including a plurality of memory cells, and configured to store optimum read voltage information determined according to a cell count value, which is the number of memory cells read as a first memory cell based on data read from the plurality of memory cells among the plurality of memory cells, and a memory controller configured to perform one or more recovery algorithms for recovering data corresponding to a failed read operation among read operations performed on the memory device. The memory controller controls the memory device to generate a read voltage used in a recovery algorithm to be currently performed among the one or more recovery algorithms based on a cell count value calculated according to a read operation corresponding to a previously performed recovery algorithm among the one or more recovery algorithms and the optimum read voltage information.

A method of operating a memory device may include a plurality of memory cells includes storing optimum read voltage information determined according to a cell count value, which is the number of memory cells read as a first memory cell based on data read from the plurality of memory cells among the plurality of memory cells, receiving an optimum read voltage setting command from a memory controller, calculating a cell count value corresponding to a default read voltage based on the data read from the plurality of memory cells using the default read voltage, in response to the optimum read voltage setting command, and generating a first optimum read voltage based on the cell count value corresponding to the default read voltage and the optimum read voltage information.

BRIEF DESCRIPTION OF THE DRAWINGS

FIG. 11 is a diagram illustrating optimum read voltage information according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a memory device having reduced latency, and a method of operating the same.

According to the present technology, a memory device having reduced latency, and a method of operating the same may be provided.

Figure 1:
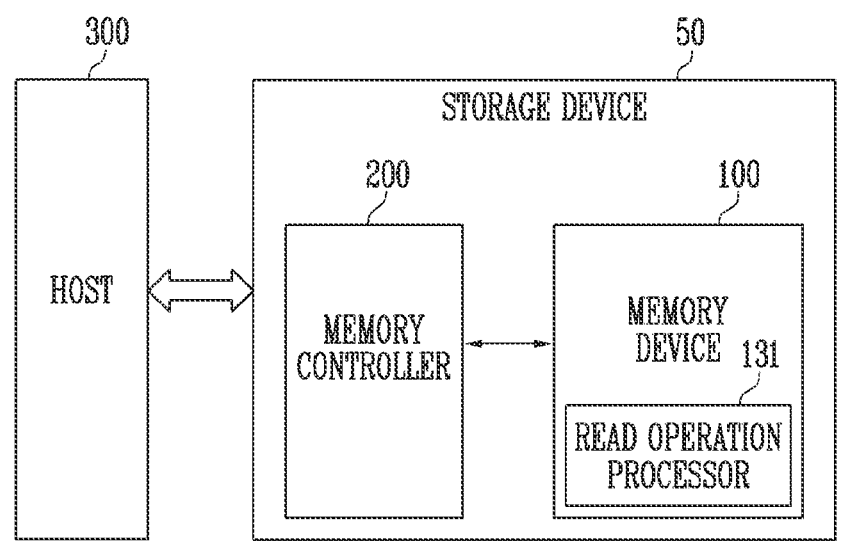
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device 100. The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array (not shown) may include a plurality of memory blocks. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command CMD and an address ADDR from the memory controller 200 and access an area selected by an address in the memory cell array. The memory device 100 may perform an operation instructed by the command CMD on the area selected by the address ADDR. For example, the memory device 100 may perform a write operation (program operation), a read operation, and an erase operation. During the program operation, the memory device 100 may program data to the area selected by the address ADDR. During the read operation, the memory device 100 may read data from the area selected by the address ADDR. During the erase operation, the memory device 100 may erase data stored in the area selected by the address ADDR.

In an embodiment, the memory device 100 may include a read operation processor 131.

The read operation processor 131 may store optimum read voltage information determined according to a cell count value, which is the number of memory cells read as a first memory cell based on data read from the plurality of memory cells among the plurality of memory cells. At this time, the read operation processor 131 may calculate the cell count value corresponding to a specific read voltage based on the data read from the plurality of memory cells using the specific read voltage. For example, the read operation processor 131 may calculate the cell count value corresponding to the specific read voltage based on a result of comparing a current sensed from the plurality of memory cells using the specific read voltage with a reference current. In addition, the read operation processor 131 may generate an optimum read voltage to be used in a recovery algorithm based on the cell count value and the optimum read voltage information. Therefore, a speed of the read operation for the recovery algorithm may be improved by generating the optimum read voltage to be used for the read operation corresponding to the recovery algorithm using the cell count value obtained through the specific read voltage and a previously stored optimum read voltage information. Accordingly, latency for the recovery algorithm may be reduced.

The memory controller 200 may control an overall operation of the storage device 50.

When power is applied to the storage device 50, the memory controller 200 may execute firmware (FW). When the memory device 100 is a flash memory device, the firmware (FW) may include a host interface layer (HIL) that controls communication with the host 300, a flash translation layer (FTL) that controls communication between the memory controller 200 and the host 300, and a flash interface layer (FIL) that controls communication with the memory device 100.

In an embodiment, the memory controller 200 may receive data and a logical block address (LBA) from the host 300 and may convert the LBA into a physical block address (PBA) indicating an address of memory cells in which data included in the memory device 100 is to be stored. In the present specification, the LBA and a "logic address" or a "logical address" may be used as the same meaning. In the present specification, the PBA and a "physical address" may be used as the same meaning.

The memory controller 200 may control the memory device 100 to perform the program operation, the read operation, the erase operation, or the like according to a request of the host 300. During the program operation, the memory controller 200 may provide a write command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data on independently regardless of the request from the host 300 and transmit the command, the address, and the data to the memory device 100. For example, the memory controller 200 may provide the command, the address, and the data for performing a read operation and program operations accompanying in performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

A read request provided from the host 300 is requesting to provide original data, which is requested to be stored in the storage device 50 by the host 300, to the host 300 again. The memory controller 200 generates write data including parity data for error correction by performing error correction encoding on the original data. The memory controller 200 may control the memory device 100 to store the write data in the memory device 100.

Thereafter, in response to the read request from the host 300, the memory controller 200 may provide a read command and a physical address indicating a position of memory cells in which the data to be read is stored to the memory device 100, in order to obtain data corresponding to the read request of the host 300 from the memory device 100.

The memory device 100 may perform the read operation using a default read voltage. A read voltage may be a voltage applied to identify data stored in the memory cell. The default read voltage may be a read voltage determined through a test during a manufacturing process of the memory device 100.

The memory device 100 may provide read data obtained by reading the data stored in the received physical address using the default read voltage to the memory controller 200. The memory controller 200 may perform error correction decoding on the read data.

The error correction decoding may be an operation of obtaining the original data by correcting an error bit included in the read data. The error correction decoding may be successful or a failure according to whether the number of error bits included in the read data is equal to or less than the number of correctable error bits. When the number of error bits included in the read data is equal to or less than the number of correctable error bits, the error correction decoding may be passed. Conversely, when the number of error bits included in the read data exceeds the number of correctable error bits, the error correction decoding may be deemed a failure or to have failed. When the error correction decoding is passed, the original data corresponding to the logical address requested by the host 300 may be obtained. Therefore, when the error correction decoding is passed, the read operation performed by the memory device 100 may be passed. When the error correction decoding is failed, the original data might not be obtained, and the read operation performed by the memory device 100 may be failed.

When the read operation is failed, the memory controller 200 may perform a plurality of recovery algorithms until the original data is obtained. The plurality of recovery algorithms may be performed according to a preset order. As complexity of the recovery algorithm increases, a possibility that the original data is to be obtained increases. However, since an amount of operations or computations to be performed by the memory controller 200 increases according to the complexity, overhead may also be increased. In an embodiment, the memory controller 200 may perform the recovery algorithms in an order from a recovery algorithm having a low complexity to a recovery algorithm having a high complexity. When the original data is obtained by any one of the recovery algorithms, the remaining recovery algorithms might not be performed.

In an embodiment, the memory controller 200 may perform one or more recovery algorithms for recovering the data corresponding to the failed read operation among the read operations performed on the memory device 100. At this time, the memory controller 200 may control the memory device 100 to generate one or more optimum read voltages to be used for the one or more recovery algorithms based on the optimum read voltage information and the cell count value calculated according to the read operation corresponding to the one or more recovery algorithms. For example, the memory controller 200 may control the memory device 100 to generate the read voltage used for a currently performed recovery algorithm among the one or more recovery algorithms based on the optimum read voltage information and the cell count value calculated according to the read operation corresponding to the previously performed recovery algorithm among the one or more recovery algorithms.

The memory controller 200 may control the memory device 100 to perform a read operation corresponding to a first recovery algorithm among the one or more recovery algorithms using the default read voltage. In an embodiment, the first recovery algorithm may be a read retry.

In addition, when the read operation using the default read voltage is failed, the memory controller 200 may calculate a cell count value corresponding to the default read voltage based on a result of comparing a current sensed from the plurality of memory cells using the default read voltage with a reference current. In an embodiment, the memory controller 200 may perform error correction decoding in a bit-flip method on data read through the read operation using the default read voltage. At this time, when the error correction decoding is failed, the memory controller 200 may calculate the cell count value based on the result of comparing the current sensed from the memory cells to which the default read voltage is applied with the reference current.

In addition, the memory controller 200 may control the memory device 100 to generate a first optimum read voltage based on the cell count value corresponding to the default read voltage and the optimum read voltage information.

The memory controller 200 may control the memory device 100 to re-perform the read operation corresponding to the first recovery algorithm using the first optimum read voltage.

In addition, when the read operation using the first optimum read voltage is failed, the memory controller 200 may calculate a cell count value corresponding to the first optimum read voltage based on a result of comparing the reference current with the current sensed from the plurality of memory cells using the first optimum read voltage. In an embodiment, the memory controller 200 may perform error correction decoding in a min-sum method on data read through the read operation using the first optimum read voltage. At this time, when the error correction decoding is failed, the memory controller 200 may calculate the cell count value based on the result of comparing the reference current with the current sensed from the memory cells to which the first optimum read voltage is applied.

In addition, the memory controller 200 may control the memory device 100 to generate a second optimum read voltage based on the cell count value corresponding to the first optimum read voltage and the optimum read voltage information.

The memory controller 200 may control the memory device 100 to perform a read operation corresponding to a second recovery algorithm among the one or more recovery algorithms using the second optimum read voltage. In an embodiment, the second recovery algorithm may be an eBoost.

In addition, when the read operation using the second optimum read voltage is failed, the memory controller 200 may control the memory device 100 to generate a plurality of soft read voltages based on the second optimum read voltage. For example, the memory controller 200 may control the memory device 100 to generate a plurality of soft read voltages having a constant offset based on the second optimum read voltage.

In addition, the memory controller 200 may control the memory device 100 to perform a third recovery algorithm among the one or more recovery algorithms using the plurality of soft read voltages. In an embodiment, the third recovery algorithm may be soft decoding.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
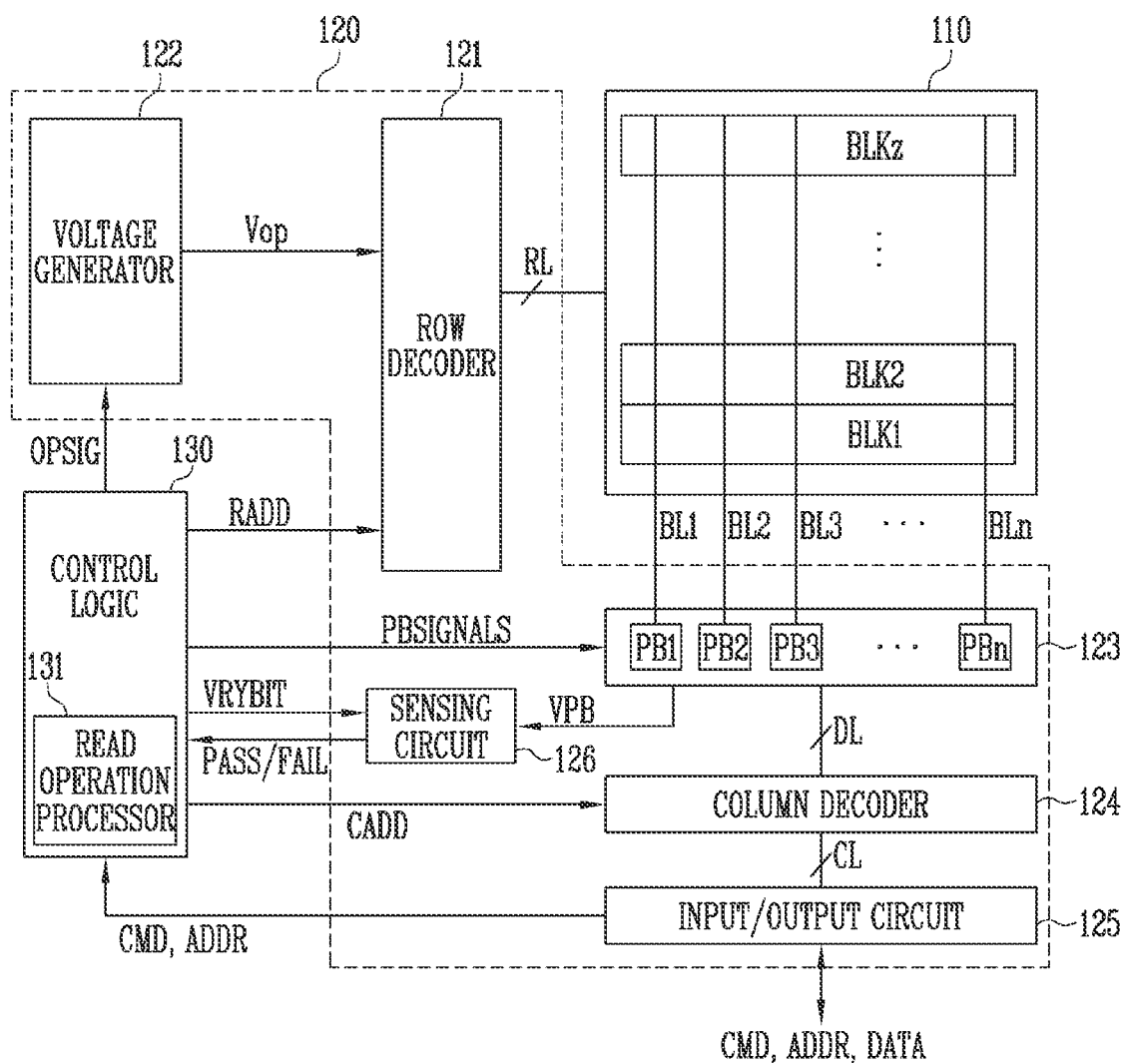
FIG. 2 is diagram illustrating a memory device of FIG. 1.

FIG. 2 is diagram illustrating a structure of the memory device 100 of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to control of the control logic 130. The row decoder 121 receives a row address RADD from the control logic 130.

The row decoder 121 is configured to decode the row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

For example, during the program operation, when the program pulse is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. The memory cell connected to the bit line to which a program permission voltage (for example, a ground voltage) is applied may have an increased threshold voltage. The threshold voltage of the memory cell connected to the bit line to which a program inhibit voltage (for example, a power voltage) is applied may be maintained. During the program verify operation, the first to n-th page buffers PB1 to PBn read page data from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuits 120. In addition, the control logic 130 may determine whether the verity operation is passed or failed in response to the pass or fail signal PASS or FAIL.

In an embodiment, the control logic 130 may include the read operation processor 131.

The read operation processor 131 may control the peripheral circuit 120 to perform a read operation according to a read command input from the memory controller 200. The read operation performed by the read operation processor 131 is described with reference to FIGS. 9 and 10.

Figure 3:
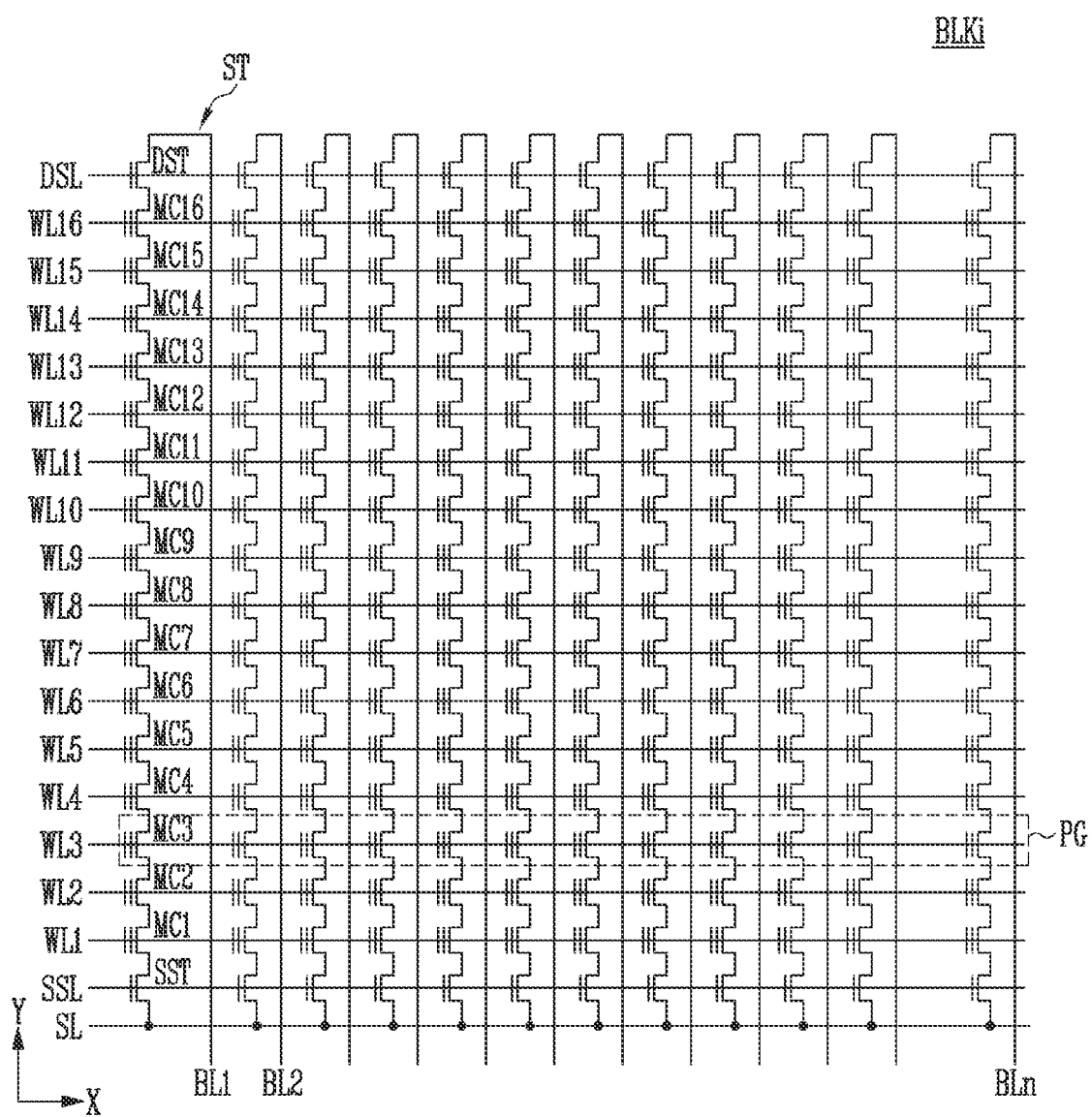
FIG. 3 is a diagram illustrating a structure of any one memory block among memory blocks of FIG. 2.

FIG. 3 is a diagram illustrating a structure of any one memory block among the memory blocks of FIG. 2.

The memory block BLKi is any one memory block BLKi among the memory blocks BLK1 to BLKi of FIG. 2.

Referring to FIG. 3, a plurality of word lines arranged in parallel with each other may be connected between the first select line and the second select line. Here, the first select line may be the source select line SSL, and the second select line may be the drain select line DSL. More specifically, the memory block 110 may include a plurality of strings ST connected between the bit lines BL1 to BLn and the source line SL. The bit lines BL1 to BLn may be connected to the strings ST, respectively, and the source line SL may be commonly connected to the strings ST. Since the strings ST may be configured to be identical to each other, a string ST connected to the first bit line BL1 will be specifically described, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKi may include the pages PG of the number of the word lines WL1 to WL16.

One memory cell may store one bit of data. This is commonly called a single level cell (SLC). In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

Figure 4:
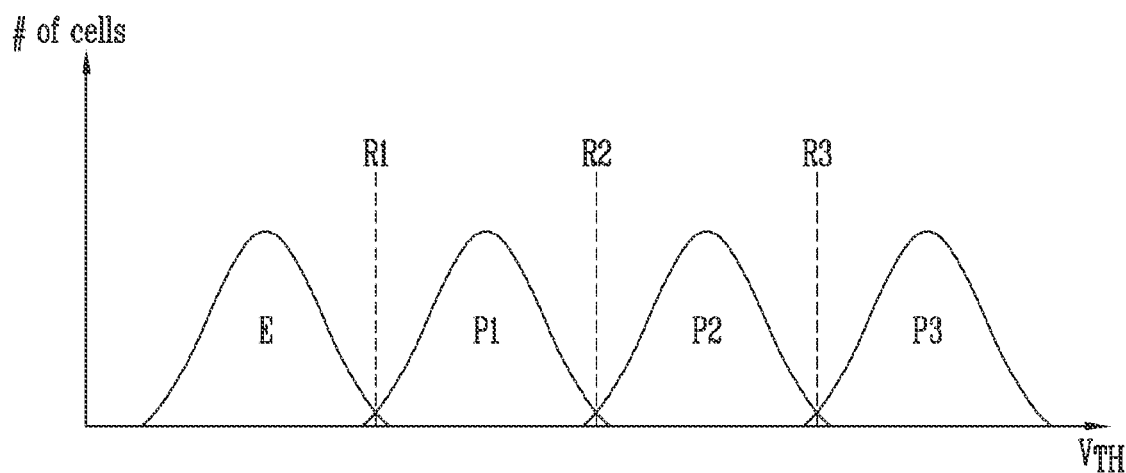
FIG. 4 is a diagram illustrating a default read voltage.

FIG. 4 is a diagram illustrating the default read voltage.

Referring to FIG. 4, a horizontal axis represents a threshold voltage of the memory cells, and a vertical axis represents the number of memory cells.

In FIG. 4, for convenience of description, it is assumed that the memory cell is programmed as a multi-level cell (MLC) storing two bits of data, but the present disclosure is not limited thereto.

The memory cells included in one physical page may have a threshold voltage belonging to a threshold voltage distribution in any one of an erase state E, and a first program state P1 to a third program state P3 through the program operation.

When the threshold voltage of the memory cells is sensed using the default read voltages R1, R2, and R3, each memory cell may be divided into any one of the erase state E, and the first program state P1 to the third program state P3 according to data stored in a corresponding memory cell. R1 may be a default read voltage for dividing the erase state E and the first program state P1, R2 may be a default read voltage for dividing the first program state P1 and the second program state P2, and R3 may be a default read voltage for dividing the second program state P2 and the third program state P3. A level of the default read voltage may be determined as a specific voltage value through a test in a manufacturing process of the memory device, and the determined voltage value may be stored in the memory device.

In the beginning of completion of the program operation, the threshold voltage distribution of the memory cells may be in a form as shown in FIG. 4. However, after data is programmed, the threshold voltage may be changed due to retention for a long time or due to an excessive operation on another memory area (disturbance).

Therefore, as the changed in the threshold voltage of the memory cells increases, more error bits may be included in the read data sensed by the default read voltage, and thus, a case where the read operation is failed may increase.

Figure 5:
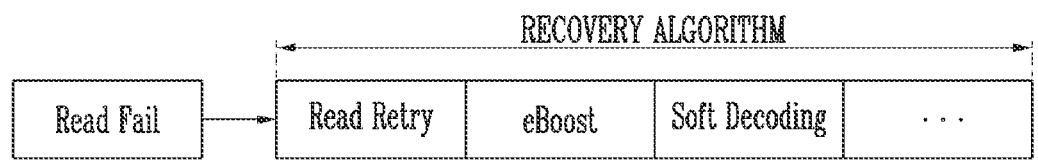
FIG. 5 is a diagram illustrating a recovery algorithm.

FIG. 5 is a diagram illustrating the recovery algorithm.

Referring to FIG. 5, when the read operation is failed, the plurality of recovery algorithms may be performed until original data corresponding to the failed read operation is obtained.

In an embodiment, the plurality of recovery algorithms may include the read retry, the eBoost, the soft decoding operation, and the like.

The read retry may be an operation of retrying the read operation using a read voltage different from the default read voltage. The read voltage used for the read retry may be stored in the memory device 100 or the memory controller 200 in advance.

The eBoost may be an operation of calculating an optimum read voltage and performing the read operation using the calculated optimum read voltage. Here, the optimum read voltage may be calculated by various methods. In an embodiment, the optimum read voltage may be calculated using Gaussian modeling. Alternatively, the optimum read voltage may be calculated according to the number of '0' or '1' included in the data read using a plurality of read voltages.

The soft decoding may be an operation of performing read operations using a plurality of soft read voltages. Here, the plurality of soft read voltages may be determined based on the default read voltage or the optimum read voltage. For example, the plurality of soft read voltages may be voltages having a magnitude increased or decreased by a constant interval based on the default read voltage or the optimum read voltage.

Figure 6:
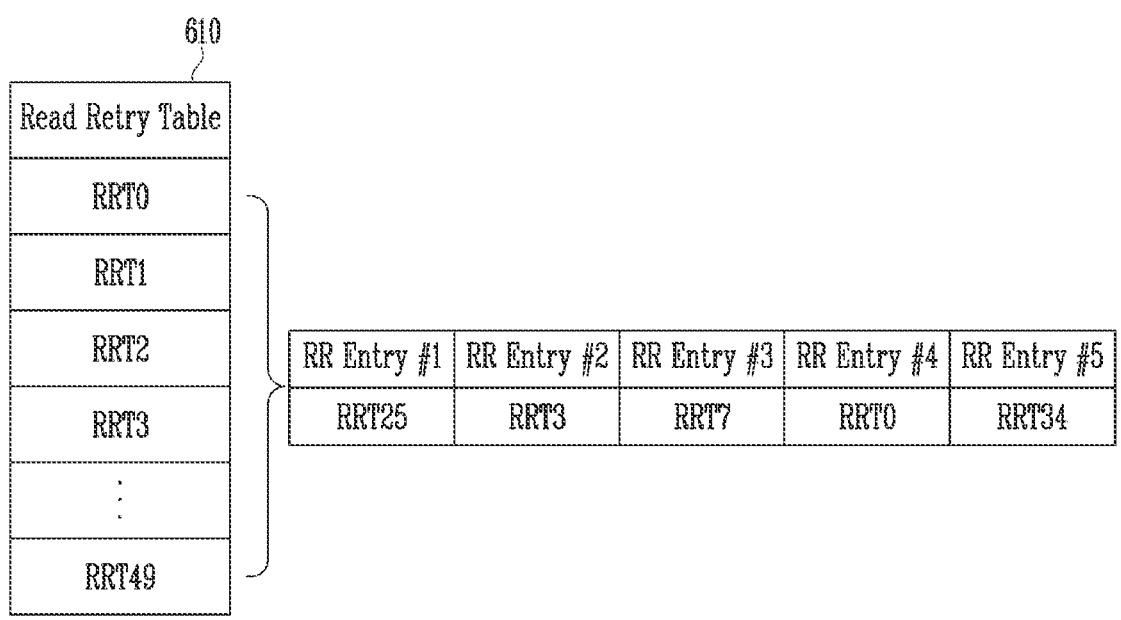
FIG. 6 is a diagram illustrating read retry.

FIG. 6 is a diagram illustrating the read retry.

Referring to FIG. 6, a read retry table 610 indicating read voltages used for the read retry may be stored in the memory device 100 or the memory controller 200 in advance.

For example, it is assumed that the read retry table 610 includes 50 read voltages RRT0 to RRT49. However, the number of read voltages included in the read retry table 610 may vary according to an embodiment.

The memory controller 200 may select five read voltages RRT25, RRT3, RRT7, RRT0, and RRT34 among the 50 read voltages RRT0 to RRT49, and may perform the read operation using the selected five read voltages RRT25, RRT3, RRT7, RRT0, and RRT34. For example, the memory controller 200 may perform the read operation by sequentially using the selected five read voltages RRT25, RRT3, RRT7, RRT0, and RRT34 until the read operation is passed.

Figure 7:
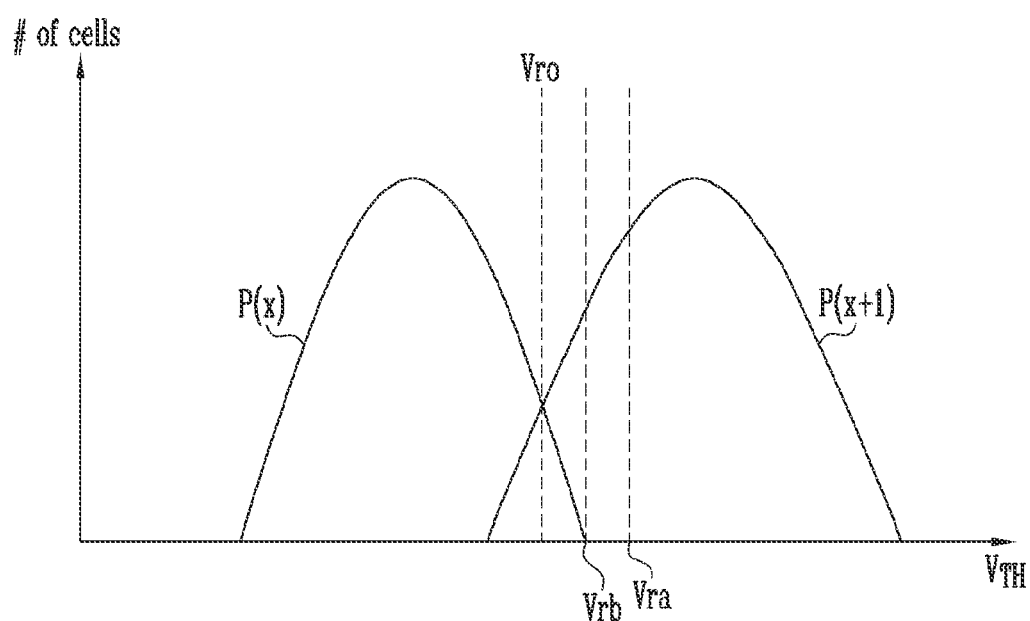
FIG. 7 is a diagram illustrating eBoost.

FIG. 7 is a diagram illustrating the eBoost.

FIG. 7 is a diagram illustrating a generalization of the threshold voltage distributions of states adjacent to each other among the erase state E and the first program state P1 to the third program state P3 of FIG. 4.

Referring to FIG. 7, a threshold voltage distribution on a left side represents a threshold voltage distribution of memory cells in a P(x) state, and a threshold voltage distribution on a right side represents a threshold voltage distribution of memory cells in a P(x+1) state.

The threshold voltages of the memory cells in the P(x) state and the P(x+1) state may be changed more than the beginning of the completion of the program, and thus the threshold voltage distributions in the two states may overlap. In this case, even though the read operation is performed with the default read voltage, many error bits may be included in the read data.

The eBoost may be an operation of calculating the optimum read voltage and performing the read operation using the calculated optimum read voltage.

The memory controller 200 may obtain the optimum read voltage Vro by performing the read operation using a plurality of sampling voltages Vra and Vrb. For example, the memory controller 200 may calculate the optimum read voltage Vro by using a change amount of the number of '0' or '1' or the number of '0' or '1' of sampled data obtained using the plurality of sampling voltages Vra and Vrb.

Meanwhile, in FIG. 7, the plurality of sampling voltages used to obtain the optimum read voltage are two, but are not limited thereto, and the number of sampling voltages used to obtain the optimum read voltage may vary according to an embodiment.

Figure 8:
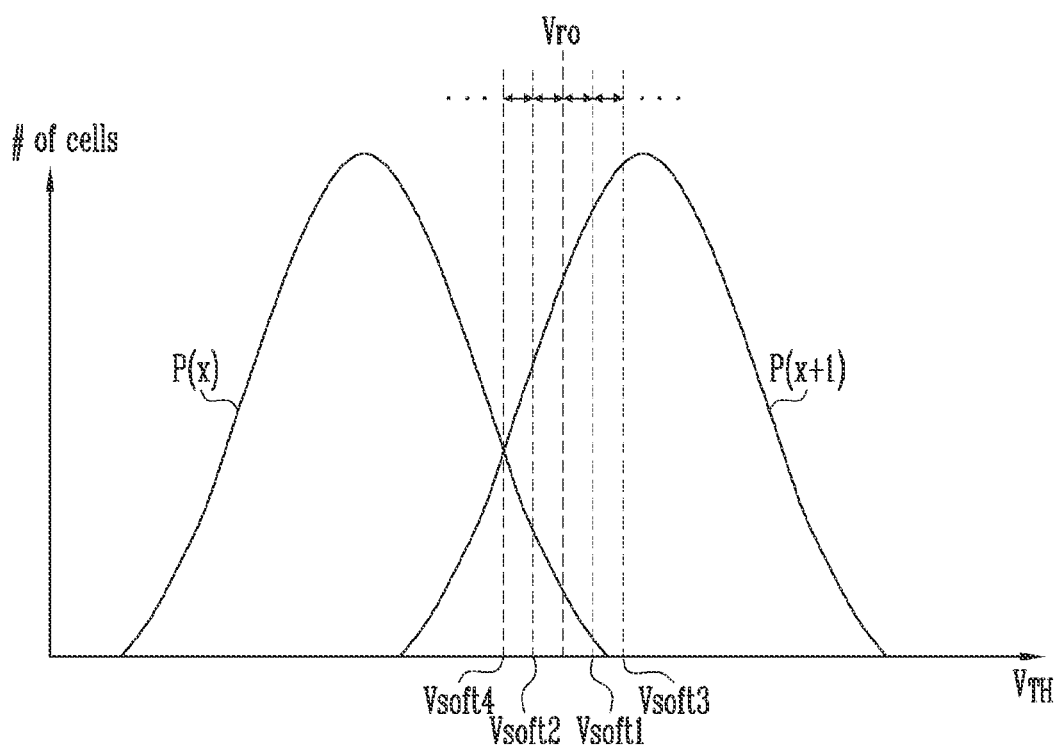
FIG. 8 is a diagram illustrating soft decoding.

FIG. 8 is a diagram illustrating the soft decoding.

Referring to FIG. 8, the threshold voltage of the memory cells in the P(x) state and the threshold voltage of the memory cells in the P(x+1) state may be changed more than that of FIG. 7. In this case, even though the read operation is performed with the optimum read voltage Vro, the read operation may be failed.

The soft decoding may be a recovery algorithm that performs the read operation using a plurality of soft read voltages having different voltage levels. The plurality of soft read voltages used for the soft decoding may be voltages having a constant offset based on the optimum read voltage Vro.

The memory controller 200 may perform the read operation while changing the read voltage in an order of a first soft read voltage Vsoft1 to a fourth soft read voltage Vsoft4.

Meanwhile, in FIG. 8, the plurality of soft read voltages used for the soft decoding are four, but are not limited thereto, and the number of soft read voltages used for the soft decoding may vary according to an embodiment.

Figure 9:
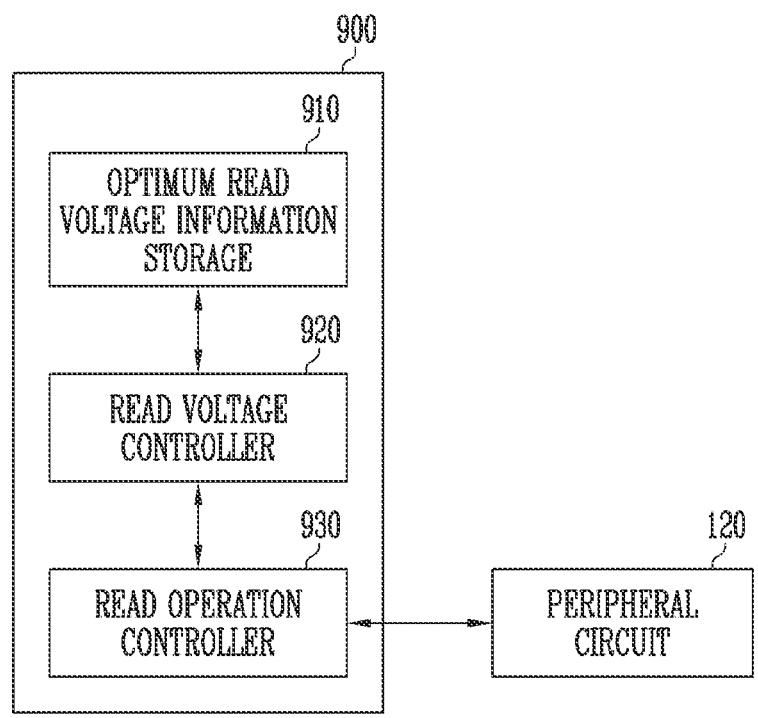
FIG. 9 is a diagram illustrating a read operation processor according to an embodiment of the present disclosure.

FIG. 9 is a diagram illustrating a read operation processor according to an embodiment of the present disclosure.

The read operation processor 900 of FIG. 9 may indicate the read operation processor 131 of FIGS. 1 and 2. The peripheral circuit 120 may be configured and operated identically to the peripheral circuit 120 described with reference to FIG. 2.

Referring to FIG. 9, the read operation processor 900 may include an optimum read voltage information storage 910, a read voltage controller 920, and a read operation controller 930.

The optimum read voltage information storage 910 may store the optimum read voltage information determined according to the cell count value, which is the number of memory cells read as a first memory cell based on the data read from the plurality of memory cells among the plurality of memory cells. At this time, the cell count value, which is the number of memory cells read as the first memory cell, may be the number of set logic values included in the read data obtained from the plurality of memory cells by applying the specific read voltage to the plurality of memory cells. For example, when the first memory cell is in an on-cell state or is an on-cell, the set logic value may be '1', and when the first memory cell is an off-cell, the set logic value may be '0'. As another example, when the first memory cell is in the on-cell state, the set logic value may be '0', and when the first memory cell is the off-cell, the set logic value may be '1'. That is, the cell count value may be the number of '0' or '1' included in the data read from the plurality of memory cells using the specific read voltage.

The optimum read voltage information may include information on the optimum read voltages predetermined through a test using a plurality of read voltages. That is, the optimum read voltage information may be a lookup table including the information on the optimum read voltages determined according to the cell count value, based on an experimental result obtained through a plurality of read operations using the plurality of read voltages.

The read voltage controller 920 may calculate the cell count value corresponding to the default read voltage based on the data read from the plurality of memory cells by using the default read voltage, in response to an optimum read voltage setting command input from the memory controller 200.

In an embodiment, the read voltage controller 920 may calculate the cell count value corresponding to the default read voltage based on the result of comparing the reference current with the current sensed from the plurality of memory cells using the default read voltage. For example, the read voltage controller 920 may sense a current flowing through the plurality of memory cells to which the default read voltage is applied, and compare the sensed current with the reference current. The read voltage controller 920 may calculate the cell count value corresponding to the default read voltage based on the result of comparing the reference current with the current sensed using the default read voltage. At this time, the reference current may be determined as a specific current value by the test in the manufacturing process of the memory device 100, and the determined current value may be stored in the memory device 100.

In addition, the read voltage controller 920 may generate the first optimum read voltage based on the cell count value corresponding to the default read voltage and the optimum read voltage information. For example, the read voltage controller 920 may generate the first optimum read voltage corresponding to the cell count value corresponding to the default read voltage based on the optimum read voltage information. At this time, the first optimum read voltage may be set as a read voltage for a next read operation to be performed after the read operation using the default read voltage.

In an embodiment, the read voltage controller 920 may convert the cell count value corresponding to the default read voltage from an analog value form to a digital value form. In addition, the read voltage controller 920 may generate the first optimum read voltage based on the optimum read voltage information and the cell count value corresponding to the default read voltage converted into the digital value form.

The read operation controller 930 may control the peripheral circuit 120 to perform the read operation on the plurality of memory cells using the default read voltage.

For example, when the read operation on the plurality of memory cells is failed, the read operation controller 930 may perform the read operation using the default read voltage in response to the read command input from the memory controller 200. At this time, the read operation using the default read voltage may be the read operation corresponding to the first recovery algorithm for recovering data corresponding to the failed read operation. In an embodiment, the first recovery algorithm may be the read retry.

In an embodiment, the read operation controller 930 may request some of the data read from the plurality of memory cells. One page including the plurality of memory cells may be divided and programmed. For example, one page may store data through four programs. In this case, a size of data stored in one page by one program may be ¼ of a size of the data stored in one page. For example, when it is assumed that the size of the data that may be stored in one page is 16 KB, the size of the data stored by one program may be 4 KB. Since one page divides and stores data, it may be determined whether a corresponding page is a program page or an erase page even though only some of data read from one page is output. Therefore, the read operation controller 930 may increase a speed of the read operation on the plurality of memory cells by requesting only some of the data read from the plurality of memory cells.

In addition, when the read operation using the default read voltage is failed, the read operation controller 930 may control the peripheral circuit 120 to perform the read operation on the plurality of memory cells using the first optimum read voltage. At this time, the read operation using the first optimum read voltage may be the read operation corresponding to the first recovery algorithm for recovering the data corresponding to the failed read operation.

For example, when the read operation using the default read voltage is failed, the read operation controller 930 may perform the read operation using the first optimum read voltage in response to the read command input from the memory controller 200.

In an embodiment, the read voltage controller 920 may calculate the cell count value corresponding to the first optimum read voltage based on the data read from the plurality of memory cells using the first optimum read voltage. For example, the read voltage controller 920 may calculate the cell count value corresponding to the first optimum read voltage based on the result of comparing the reference current with the current sensed from the plurality of memory cells using the first optimum read voltage. For example, the read voltage controller 920 may sense the current flowing through the plurality of memory cells to which the first optimum read voltage is applied, and compare the sensed current with the reference current. The read voltage controller 920 may calculate the cell count value corresponding to the first optimum read voltage based on the result of comparing the reference current with the current sensed using the first optimum read voltage.

In addition, the read voltage controller 920 may generate the second optimum read voltage based on the optimum read voltage information and the cell count value corresponding to the first optimum read voltage. For example, the read voltage controller 920 may generate the second optimum read voltage corresponding to the cell count value corresponding to the first optimum read voltage based on the optimum read voltage information. At this time, the second optimum read voltage may be set as a read voltage for a next read operation to be performed after the read operation using the first optimum read voltage.

In an embodiment, the read voltage controller 920 may convert the cell count value corresponding to the first optimum read voltage from an analog value form to a digital value form. In addition, the read voltage controller 920 may generate the second optimum read voltage based on the cell count value corresponding to the first optimum read voltage converted into the digital value form and the optimum read voltage information.

In addition, when the read operation using the first optimum read voltage is failed, the read operation controller 930 may control the peripheral circuit 120 to perform the read operation on the plurality of memory cells using the second optimum read voltage. At this time, the read operation using the second optimum read voltage may be the read operation corresponding to the second recovery algorithm for recovering data corresponding to the failed read operation. In an embodiment, the second recovery algorithm may be an eBoost operation.

For example, when the read operation using the first optimum read voltage is failed, the read operation controller 930 may perform the read operation using the second optimum read voltage in response to the read command input from the memory controller 200.

In an embodiment, when the read operation using the second optimum read voltage is failed, the read voltage controller 920 may generate the plurality of soft read voltages based on the second optimum read voltage. For example, the read voltage controller 920 may generate the plurality of soft read voltages, which are voltages having a constant offset based on the second optimum read voltage.

In addition, the read operation controller 930 may control the peripheral circuit 120 to perform the plurality of read operations on the plurality of memory cells using the plurality of soft read voltages. At this time, the read operations using the plurality of soft read voltages may be read operations corresponding to the third recovery algorithm for recovering data corresponding to the failed read operation. In an embodiment, the third recovery algorithm may be the soft decoding.

According to an embodiment of the present disclosure, a speed of the read operation for the recovery algorithm may be improved by generating the optimum read voltage to be used for the read operation corresponding to the recovery algorithm using the cell count value obtained through the specific read voltage and the previously stored optimum read voltage information. Accordingly, latency for the recovery algorithm may be reduced.

Figure 10:
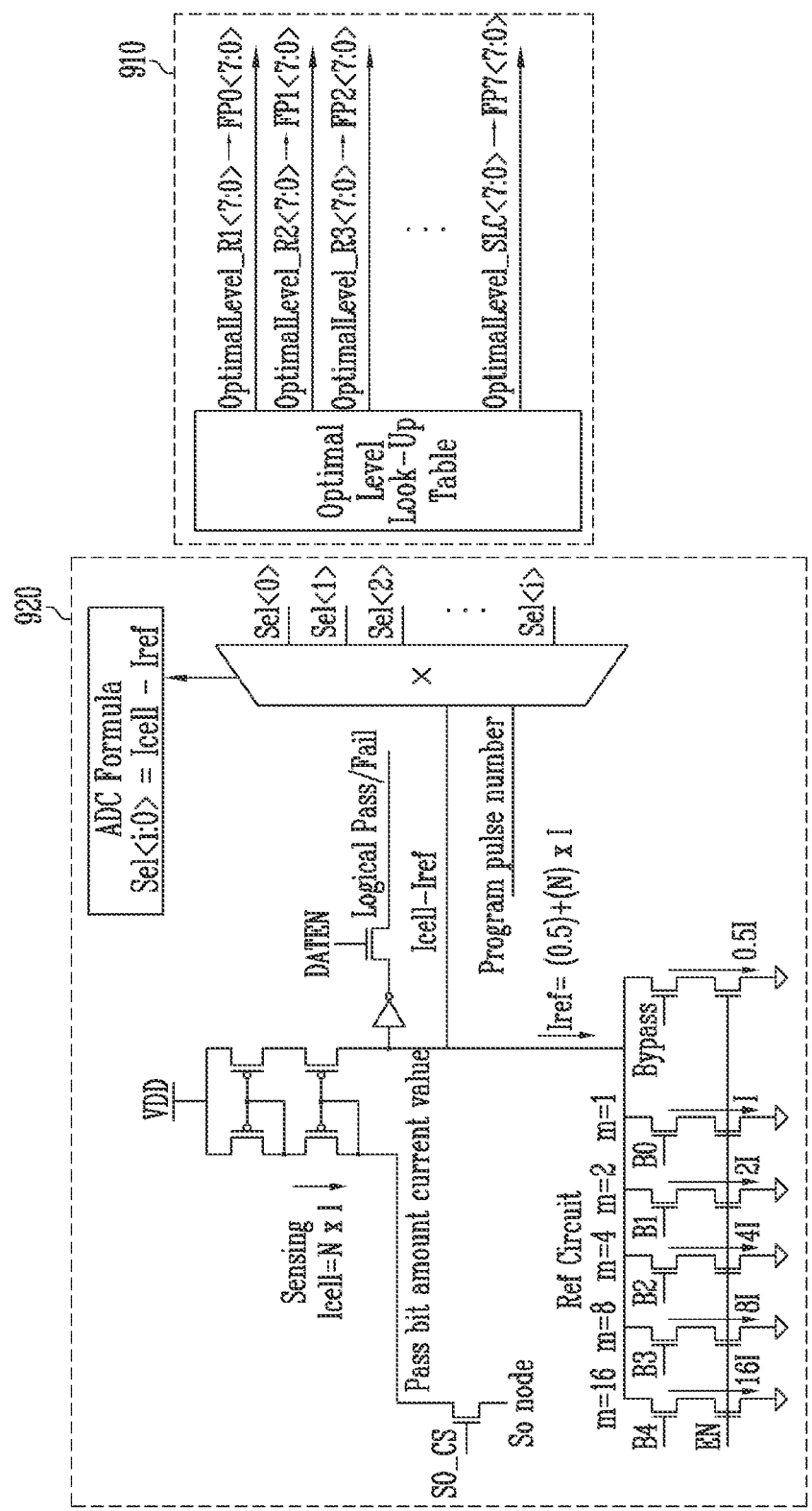
FIG. 10 is a circuit diagram illustrating an embodiment of an optimum read voltage information storage and a read voltage controller of FIG. 9.

FIG. 10 is a circuit diagram illustrating an embodiment of the optimum read voltage information storage and the read voltage controller of FIG. 9.

Referring to FIG. 10, the read voltage controller 920 may obtain a current value Icell flowing through the plurality of memory cells to which the specific read voltage is applied. For example, the read voltage controller 920 may obtain the current value Icell through the product of the number of memory cells N and a current value I flowing through one memory cell. At this time, the plurality of memory cells may be connected in a chunk unit of the page buffer, and the current value Icell obtained from the plurality of memory cells may be obtained in the chunk unit of the page buffer. The read voltage controller 920 may sense a current value Icell using a sensing node SO node and a transistor SO_CS connected to the sensing node SO node.

In addition, the read voltage controller 920 may calculate the cell count values Sel<0> to Sel<i> based on a result of comparing the current Icell sensed from the plurality of memory cells with a reference current Iref. For example, the read voltage controller 920 may calculate the cell count values through the difference between the current Icell and the reference current Iref (i.e., Sel<i:0>=Icell−Iref). At this time, the cell count value may be calculated in an analog value form. In this case, the read voltage controller 920 may convert the cell count value from the analog value form to a digital value form. Thereafter, the read voltage controller 920 may generate the optimum read voltages OptimalLevel_R1<7:0> to OptimalLevel_SLC<7:0> based on the cell count value converted into the digital value form and the optimum read voltage information stored in the optimum read voltage information storage 910. At this time, when it is assumed that the memory cell is a triple-level cell storing three data bits, the read voltage controller 920 may generate an optimum read voltage from level 1 to level 7. In addition, the memory device 100 may generate an optimum read voltage to be applied during a read operation of a single-level cell unit. The optimum read voltages OptimalLevel_R1<7:0> to OptimalLevel_SLC<7:0> may be stored in the feature parameters FP0<7:0> to FP7<7:0>.

In an embodiment, the read voltage controller 920 may include a reference current setting circuit Ref Circuit for setting the reference current Iref. The reference current setting circuit Ref Circuit may include a plurality of transistors B0 to B4. The plurality of transistors B0 to B4 may be an nMOS (n-type metal-oxide semiconductor) transistor. In addition, the reference current setting circuit Ref Circuit may include an enable transistor EN. The read voltage controller 920 may set various reference currents Iref using the reference current setting circuit Ref Circuit according to an embodiment. The reference current setting circuit Ref Circuit may adjust a plurality of current 0.5 I to 16 I using the plurality of transistors B0 to B4 and the enable transistor EN. The reference current setting circuit Ref Circuit may set various reference currents Iref using the plurality of current 0.5 I to 16 I.

FIG. 11 is a diagram illustrating the optimum read voltage information according to an embodiment of the present disclosure.

Referring to FIG. 11, the optimum read voltage information may be a lookup table indicating a relationship between the cell count value and the optimum read voltages to be used for the recovery algorithm.

The optimum read voltage information may include optimum read voltages corresponding to a plurality of cell count values (i.e., first cell count value Sel<1> to ith cell count value Sel<i> where i is a natural number). At this time, the optimum read voltage information may include optimum read voltages for each of the read retry and the eBoost.

For example, when the cell count value calculated by a specific read operation which is previously performed is 20 in a process of determining the optimum read voltage to be used for the read operation corresponding to the read retry, the optimum read voltage to be used for the read operation corresponding to the read retry may be determined as 2.0.

As another example, when the cell count value calculated by the specific read operation which is previously performed is 1 in a process of determining the optimum read voltage to be used for the read operation corresponding to the eBoost, the optimum read voltage to be used for the read operation corresponding to the eBoost may be determined as 3.5.

Meanwhile, in FIG. 11, one piece of optimum read voltage information is shown, but the optimum read voltage information may exist for each level of the read voltage. For example, when it is assumed that the memory cell is a triple-level cell that stores three data bits, the memory device 100 may store optimum read voltage information for each of the read voltages from level 1 to level 7. In addition, the memory device 100 may store the optimum read voltage information for the read voltage of the level 1 applied during the read operation of the single-level cell unit.

Figure 12A:
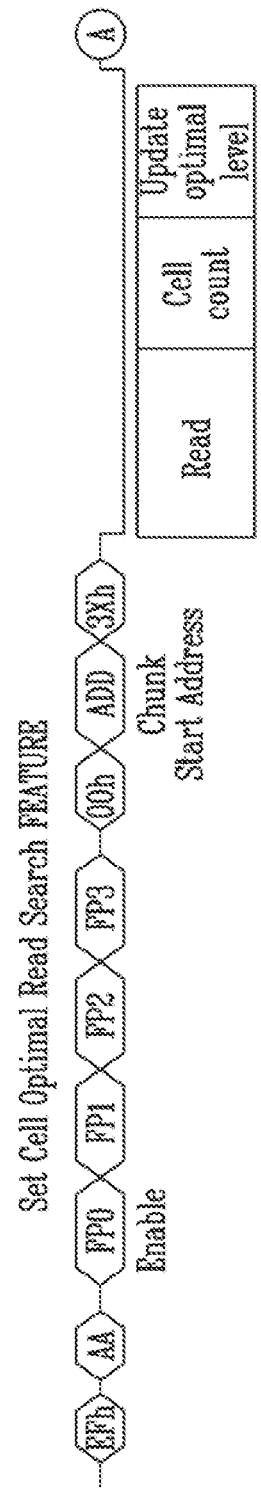
FIG. 12A is a diagram illustrating an optimum read voltage setting command according to an embodiment of the present disclosure.
Figure 12B:
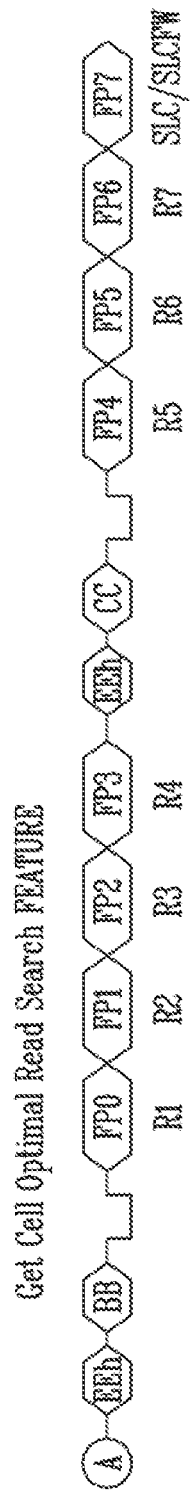
FIG. 12B is a diagram illustrating an optimum read voltage obtainment command according to an embodiment of the present disclosure.

FIG. 12A is a diagram illustrating the optimum read voltage setting command according to an embodiment of the present disclosure. In addition, FIG. 12B is a diagram illustrating an optimum read voltage obtainment command according to an embodiment of the present disclosure.

In an embodiment, the optimum read voltage setting command EFh and the optimum read voltage obtainment command EEh may be commands generated by the memory controller.

Referring to FIG. 12A, when the optimum read voltage setting command EFh and a feature parameter selection command AA are input from the memory controller 200, the memory device 100 may store the optimum read voltage in enabled feature parameters FP0 to FP3. For example, when the optimum read voltage setting command EFh the feature parameter selection command AA are input, the memory device 100 may perform a read operation on memory cells corresponding to a selected address ADD according to read commands 00h to 3Xh, and calculate the cell count value corresponding to the corresponding read operation. In addition, the memory device 100 may generate the optimum read voltage based on the calculated cell count value and the optimum read voltage information, and store the generated optimum read voltage in the feature parameters FP0 to FP3.

Meanwhile, in FIG. 12A, only the optimum read voltage setting operation on the feature parameters FP0 to FP3 is shown, but the same optimum read voltage setting operation may be performed on other feature parameters FP4 to FP7.

In addition, referring to FIG. 12B, when the optimum read voltage obtainment command EEh is input from the memory controller 200, the memory device 100 may provide the optimum read voltages stored in the feature parameters FP0 to FP7 to the memory controller 200. The feature parameters FP0 to FP6 may store the optimum read voltages R1 to R7 from level 1 to level 7. The feature parameters FP7 may store the optimum read voltage SLC/SLCFW of a single-level cell unit. For example, when the optimum read voltage obtainment command EEh and a feature parameter selection command BB are input from the memory controller 200, the memory device 100 may provide the optimum read voltages stored in the feature parameters FP0 to FP3 to the memory controller 200. When the optimum read voltage obtainment command EEh and a feature parameter selection command CC are input from the memory controller 200, the memory device 100 may provide the optimum read voltages stored in the feature parameters FP4 to FP7 to the memory controller 200.

Figure 13:
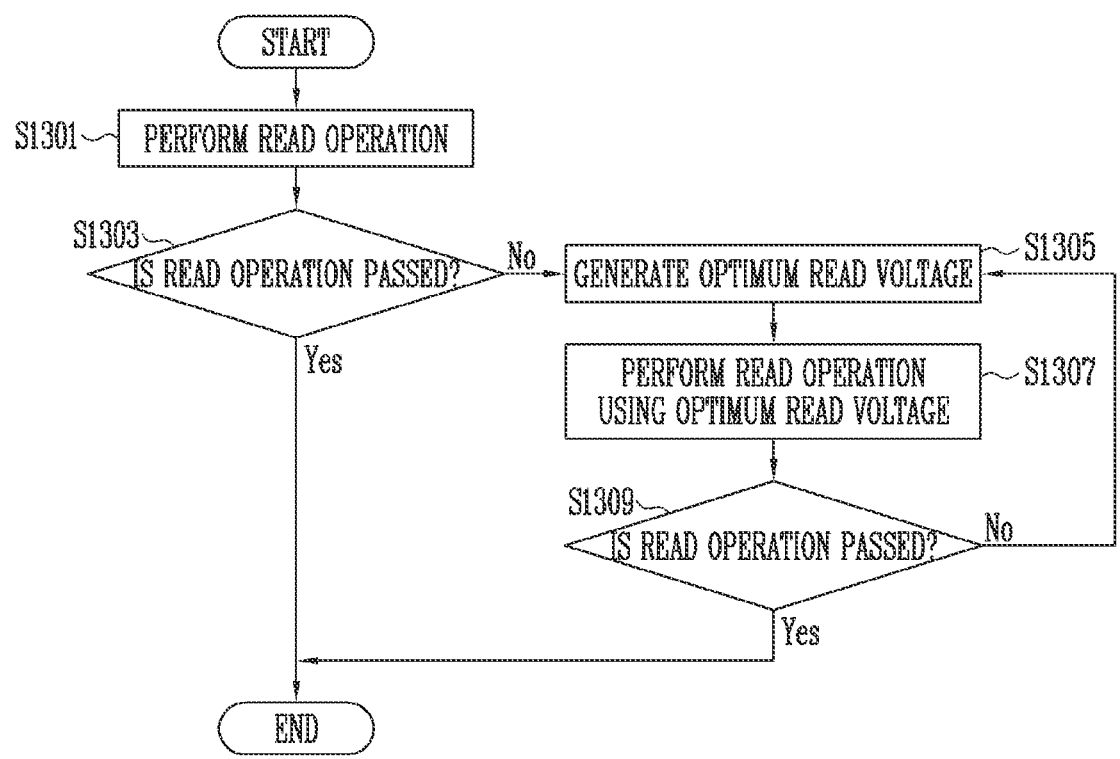
FIG. 13 is a flowchart illustrating a method of operating the storage device according to an embodiment of the present disclosure.

FIG. 13 is a flowchart illustrating a method of operating the storage device according to an embodiment of the present disclosure.

The method shown in FIG. 13 may be performed, for example, by the storage device 50 shown in FIG. 1.

In step S1301, the storage device 50 may perform the read operation on the plurality of memory cells.

In step S1303, the storage device 50 may determine whether the read operation on the plurality of memory cells is failed.

For example, the storage device 50 may determine whether the read operation is passed by performing the error correction decoding on the data read by the read operation.

When the read operation is passed according to a determination result in step S1303, the storage device 50 may end the read operation.

In contrast, when the read operation is failed according to the determination result in step S1303, the storage device 50 may perform the one or more recovery algorithms.

For example, when the read operation is failed according to the determination result in step S1303, the storage device 50 may generate the optimum read voltage in step S1305.

For example, the storage device 50 may generate the optimum read voltage to be used for the recovery algorithm based on the cell count calculated according to the read operation and the previously stored optimum read voltage information.

In step S1307, the storage device 50 may perform the read operation corresponding to the recovery algorithm using the optimum read voltage.

In step S1309, the storage device 50 may determine whether the read operation corresponding to the optimum read voltage is passed.

For example, the storage device 50 may determine whether the read operation is passed by performing the error correction decoding on the data read by the read operation corresponding to the optimum read voltage.

When the read operation is passed according to the determination result in step S1309, the storage device 50 may end the read operation.

In contrast, when the read operation is failed according to the determination result in step S1309, the storage device 50 may generate the optimum read voltage again and perform the read operation corresponding to the recovery algorithm using the optimum read voltage which is generated again.

Figure 14:
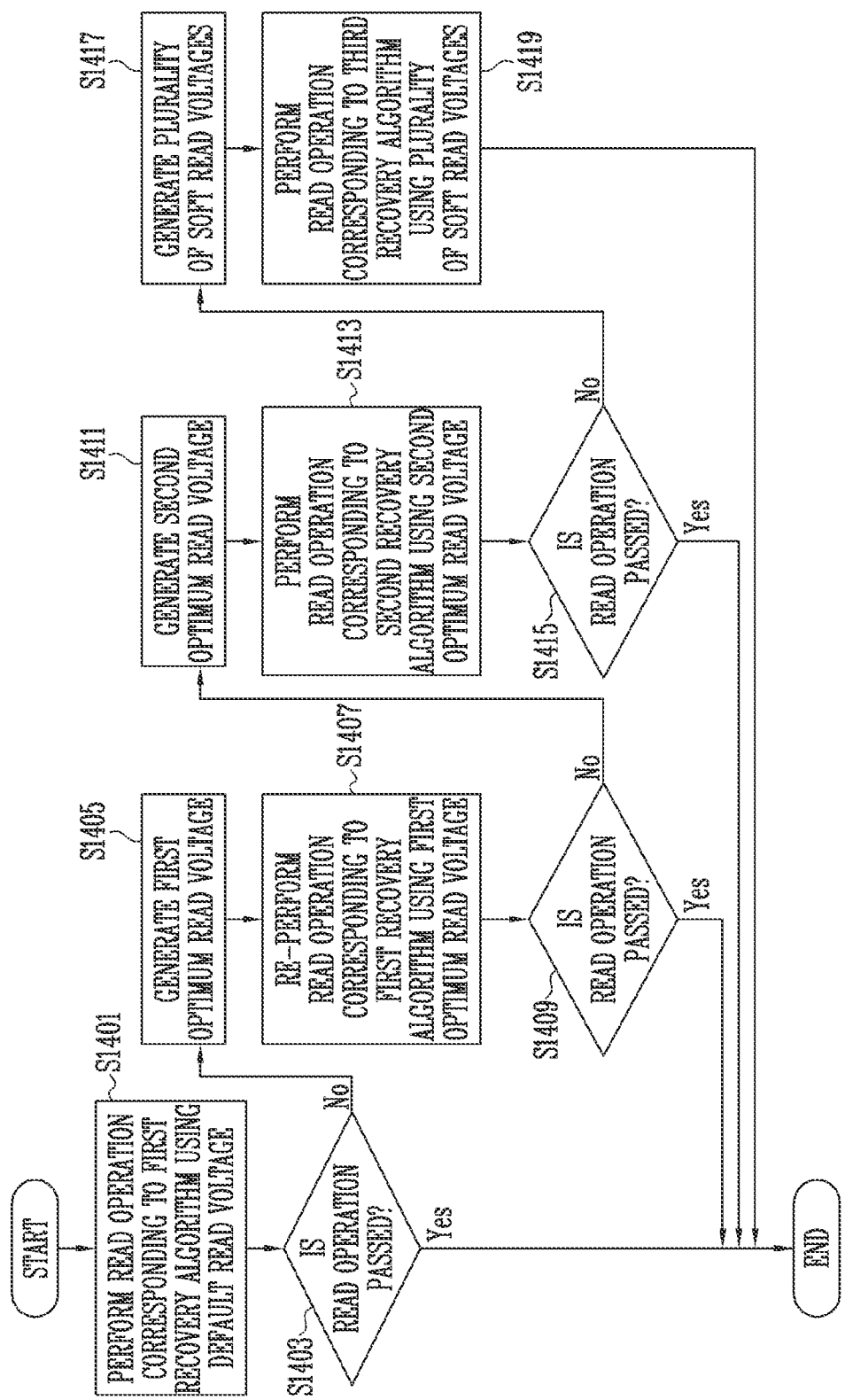
FIG. 14 is a flowchart illustrating a method of performing the recovery algorithm according to an embodiment of the present disclosure.

FIG. 14 is a flowchart illustrating a method of performing the recovery algorithm according to an embodiment of the present disclosure.

In an embodiment, the method shown in FIG. 14 may be a method for a recovery algorithm operation described through steps S1305, S1307, and S1309 shown in FIG. 13.

The method shown in FIG. 14 may be performed, for example, by the storage device 50 shown in FIG. 1.

In step S1401, the storage device 50 may perform the read operation corresponding to the first recovery algorithm using the default read voltage. In an embodiment, the first recovery algorithm may be the read retry.

In step S1403, the storage device 50 may determine whether the read operation using the default read voltage is passed. For example, the storage device 50 may perform the error correction decoding in the bit-flip method on the data read through the read operation using the default read voltage. At this time, the storage device 50 may determine whether the read operation using the default read voltage is passed based on whether the error correction decoding is passed/failed.

When the read operation using the default read voltage is passed according to a determination result in step S1403, the storage device 50 may end the recovery algorithm operation.

In contrast, when the read operation using the default read voltage is failed according to the determination result in step S1403, in step S1405, the storage device 50 may generate the first optimum read voltage based on the cell count value corresponding to the default read voltage and the optimum read voltage information. For example, the storage device 50 may calculate the cell count value corresponding to the default read voltage based on the result of comparing the reference current with the current sensed from the plurality of memory cells using the default read voltage. Thereafter, the storage device 50 may generate the first optimum read voltage based on the cell count value corresponding to the default read voltage and the optimum read voltage information.

In step S1407, the storage device 50 may re-perform the read operation corresponding to the first recovery algorithm using the first optimum read voltage.

In step S1409, the storage device 50 may determine whether the read operation using the first optimum read voltage is passed. For example, the storage device 50 may perform the error correction decoding of the min-sum method on the data read through the read operation using the first optimum read voltage. At this time, the storage device 50 may determine whether the read operation using the first optimum read voltage is passed based on whether the error correction decoding is passed/failed.

When the read operation using the first optimum read voltage is passed according to a determination result in step S1409, the storage device 50 may end the recovery algorithm operation.

In contrast, when the read operation using the first optimum read voltage is failed according to the determination result in step S1409, in step S1411, the storage device 50 may generate the second optimum read voltage based on the cell count value corresponding to the first optimum read voltage and the optimum read voltage information. For example, the storage device 50 may calculate the cell count value corresponding to the first optimum read voltage based on the result of comparing the reference current with the current sensed from the plurality of memory cells using the first optimum read voltage. Thereafter, the storage device 50 may generate the second optimum read voltage based on the cell count value corresponding to the first optimum read voltage and the optimum read voltage information.

In step S1413, the storage device 50 may perform the read operation corresponding to the second recovery algorithm using the second optimum read voltage. In an embodiment, the second recovery algorithm may be the eBoost.

In step S1415, the storage device 50 may determine whether the read operation using the second optimum read voltage is passed. For example, the storage device 50 may perform the error correction decoding in the min-sum method on the data read through the read operation using the second optimum read voltage. At this time, the storage device 50 may determine whether the read operation using the second optimum read voltage is passed based on whether the error correction decoding is passed/failed.

When the read operation using the second optimum read voltage is passed according to a determination result in step S1415, the storage device 50 may end the recovery algorithm operation.

In contrast, when the read operation using the second optimum read voltage is failed according to the determination result in step S1415, in step S1417, the storage device 50 generates the plurality of soft read voltages based on the second optimum read voltage. For example, the storage device 50 may generate the plurality of soft read voltages having the constant offset based on the second optimum read voltage.

In step S1419, the storage device 50 may perform the read operation corresponding to the third recovery algorithm using the plurality of soft read voltages. In an embodiment, the third recovery algorithm may be the soft decoding.

Figure 15:
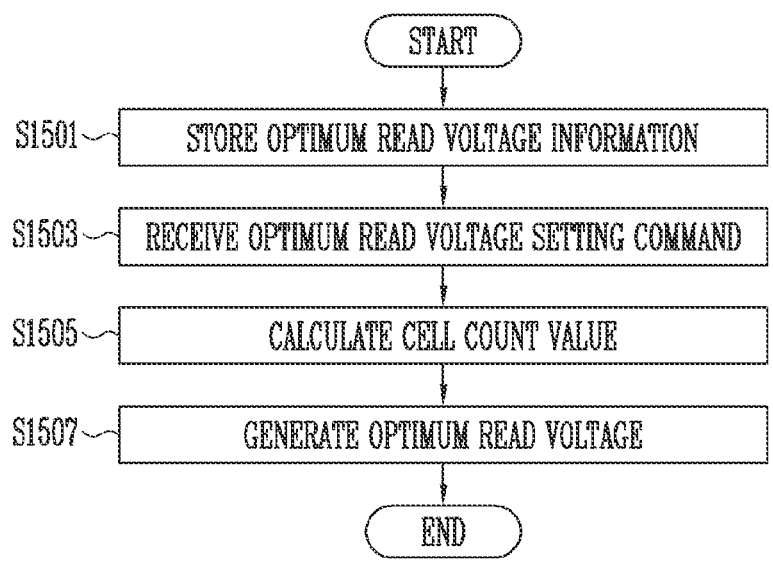
FIG. 15 is a flowchart illustrating a method of operating the memory device according to an embodiment of the present disclosure.

FIG. 15 is a flowchart illustrating a method of operating the memory device according to an embodiment of the present disclosure.

The method shown in FIG. 15 may be performed, for example, by the memory device 100 shown in FIGS. 1 and 2.

In step S1501, the memory device 100 may store the optimum read voltage information determined according to the cell count value, which is the number of memory cells read as the first memory cell based on the data read from the plurality of memory cells among the plurality of memory cells.

In step S1503, the memory device 100 may receive the optimum read voltage setting command from the memory controller.

In step S1505, the memory device 100 may calculate the cell count value corresponding to the default read voltage based on the data read from the plurality of memory cells using the default read voltage, in response to the optimum read voltage setting command.

In step S1507, the memory device 100 may generate the first optimum read voltage based on the cell count value corresponding to the default read voltage and the optimum read voltage information.

Figure 16:
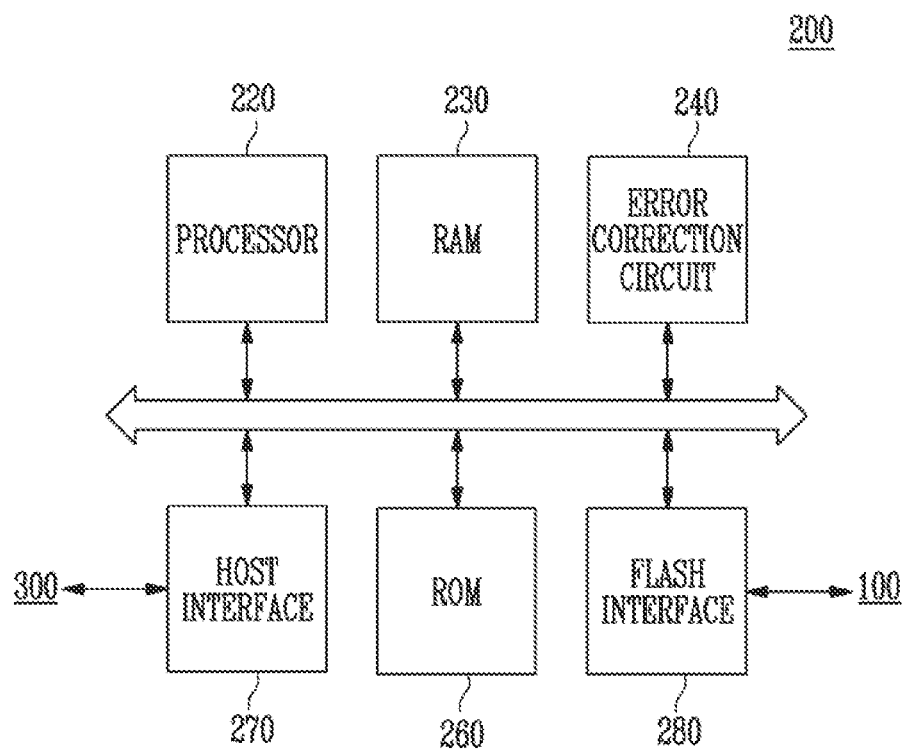
FIG. 16 is a diagram illustrating a memory controller of FIG. 1.

FIG. 16 is a diagram illustrating the memory controllers of FIG. 1.

Referring to FIGS. 1 and 16, the memory controller 200 may include a processor 220, a RAM 230, an error correction circuit 240, a ROM 260, a host interface 270, and a flash interface 280.

The processor 220 may control an overall operation of the memory controller 200. The RAM 230 may be used as a buffer memory, a cache memory, an operation memory, and the like of the memory controller 200.

The error correction circuit 240 may perform error correction. The error correction circuit 240 may perform error correction encoding (ECC encoding) based on data to be written to the memory device through the flash interface 280. The error correction encoded data may be transferred to the memory device through the flash interface 280. The error correction circuit 240 may perform error correction decoding (ECC decoding) on data received from the memory device through the flash interface 280. For example, the error correction circuit 240 may be included in the flash interface 280 as a component of the flash interface 280.

The ROM 260 may store various information required for the memory controller 200 to operate in a firmware form.

The memory controller 200 may communicate with an external device (for example, the host 300, an application processor, and the like) through the host interface 270.

The memory controller 200 may communicate with the memory device 100 through the flash interface 280. The memory controller 1200 may transmit a command CMD, an address ADDR, a control signal CTRL, and the like to the memory device 100 and receive data DATA through the flash interface 1280. For example, the flash interface 280 may include a NAND interface.

Figure 17:
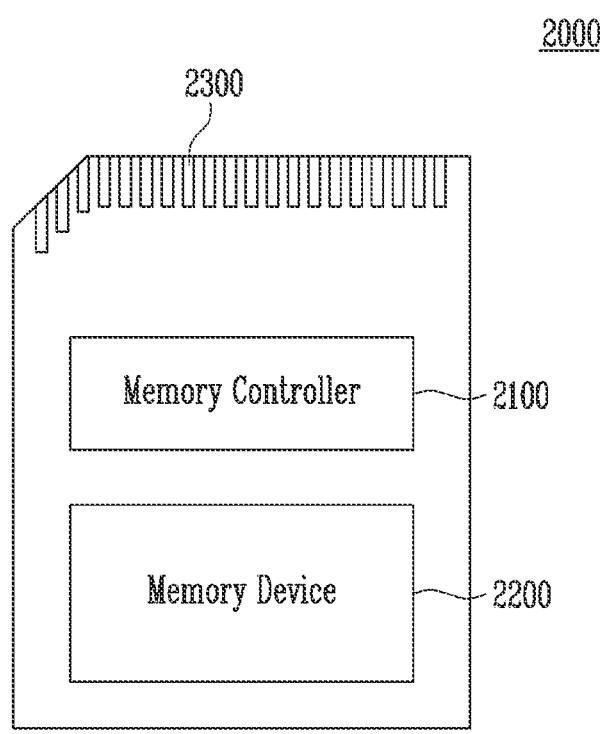
FIG. 17 is a block diagram illustrating a memory card system to which the storage device according to an embodiment of the present disclosure is applied.

FIG. 17 is a block diagram illustrating a memory card system to which the storage device according to an embodiment of the present disclosure is applied.

Referring to FIG. 17, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented equally to the memory controller 200 described with reference to FIG. 1. The memory device 2200 may be implemented identically to the memory device 100 described with reference to FIG. 2.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 18:
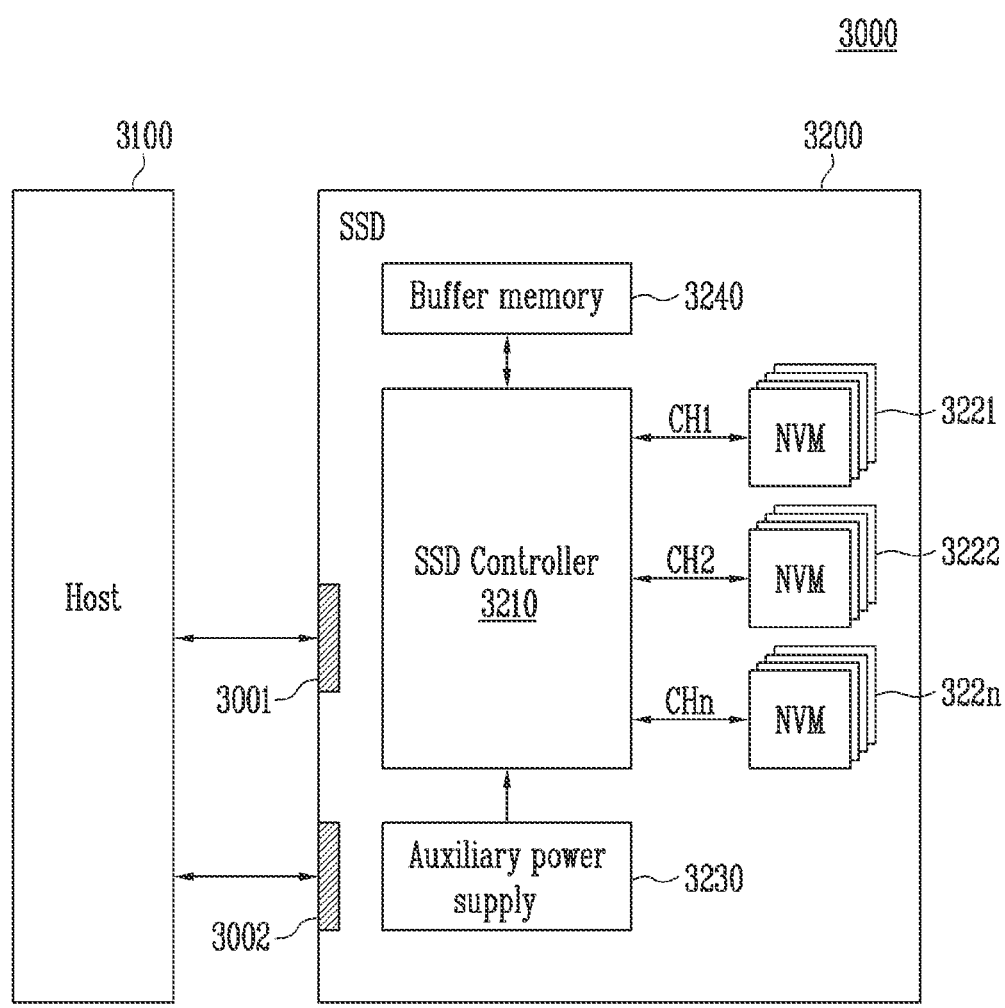
FIG. 18 is a block diagram illustrating a solid state drive (SSD) system to which the storage device according to an embodiment of the present disclosure is applied.

FIG. 18 is a block diagram illustrating a solid state drive (SSD) system to which the storage device according to an embodiment of the present disclosure is applied.

Referring to FIG. 18, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 19:
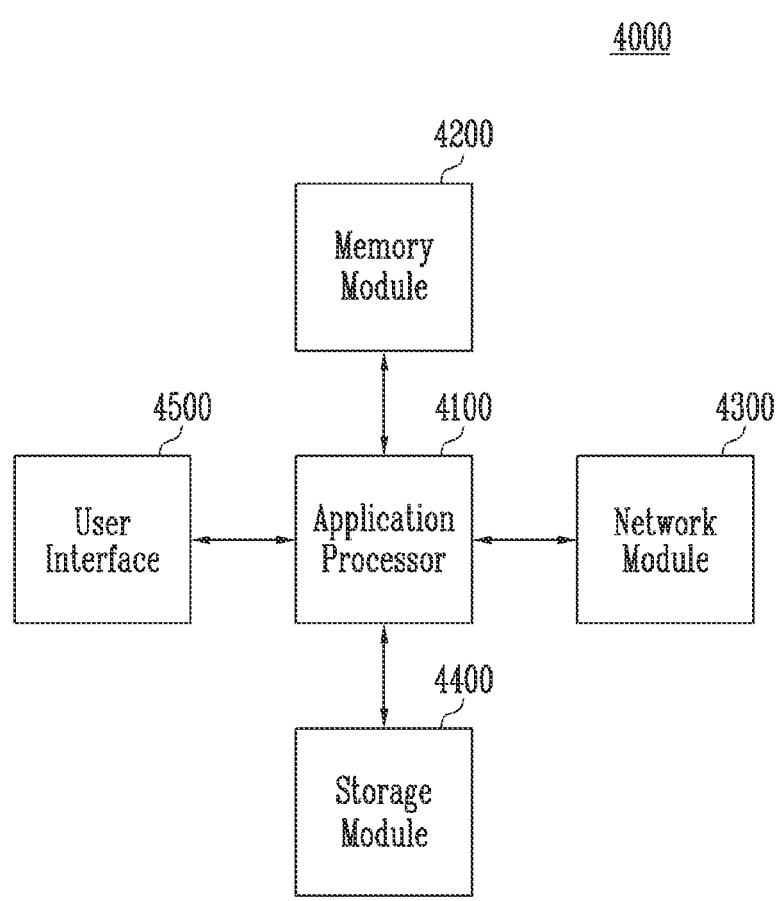
FIG. 19 is a block diagram illustrating a user system to which the storage device according to an embodiment of the present disclosure is applied.

FIG. 19 is a block diagram illustrating a user system to which the storage device according to an embodiment of the present disclosure is applied.

Referring to FIG. 19, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
a plurality of memory cells;
an optimum read voltage information storage configured to store optimum read voltage information corresponding to a cell count value, which is a number of memory cells read as a first memory cell based on a portion of data read from selected memory cells which are coupled to a single word line among the plurality of memory cells; and
a read voltage controller configured to calculate a cell count value corresponding to a default read voltage based on the portion of data read from the selected memory cells using the default read voltage, in response to an optimum read voltage setting command input from a memory controller, and generate a first optimum read voltage based on the cell count value corresponding to the default read voltage and the optimum read voltage information.

2. The memory device of claim 1, wherein the first memory cell is an on-cell or an off-cell.

3. The memory device of claim 1, wherein the read voltage controller converts the cell count value corresponding to the default read voltage from an analog value form to a digital value form, and generates the first optimum read voltage based on the cell count value converted into the digital value form and the optimum read voltage information.

4. The memory device of claim 1, further comprising:
a peripheral circuit configured to perform a read operation of sensing the selected memory cells; and
a read operation controller configured to control the peripheral circuit to perform the read operation on the selected memory cells using the default read voltage.

5. The memory device of claim 4, wherein the read operation controller requests the portion of data read from the selected memory cells.

6. The memory device of claim 4, wherein the read voltage controller calculates the cell count value corresponding to the default read voltage based on a result of comparing a current sensed from the selected memory cells using the default read voltage with a reference current.

7. The memory device of claim 5, wherein when the read operation using the default read voltage is failed, the read operation controller controls the peripheral circuit to perform the read operation on the selected memory cells using the first optimum read voltage.

8. The memory device of claim 7, wherein the read voltage controller calculates a cell count value corresponding to the first optimum read voltage based on the portion of data read from the selected memory cells using the first optimum read voltage, and generates a second optimum read voltage based on the cell count value corresponding to the first optimum read voltage and the optimum read voltage information.

9. The memory device of claim 8, wherein the read voltage controller calculates the cell count value corresponding to the first optimum read voltage based on a result of comparing a current sensed from the selected memory cells using the first optimum read voltage with a reference current.

10. The memory device of claim 8, wherein when a read operation using the first optimum read voltage is failed, the read operation controller controls the peripheral circuit to perform the read operation on the selected memory cells using the second optimum read voltage.

11. The memory device of claim 10, wherein the read voltage controller generates a plurality of soft read voltages based on the second optimum read voltage when a read operation using the second optimum read voltage is failed.

12. The memory device of claim 11, wherein the read operation controller controls the peripheral circuit to perform a plurality of read operations on the selected memory cells using the plurality of soft read voltages.

13. A storage device comprising:
a memory device including a plurality of memory cells, and configured to store optimum read voltage information determined according to a cell count value, which is the number of memory cells read as a first memory cell based on a portion of data read from a portion of the plurality of memory cells among the plurality of memory cells; and
a memory controller configured to perform one or more recovery algorithms for recovering data corresponding to a failed read operation among read operations performed on the memory device, wherein the memory controller controls the memory device to generate a read voltage used in a recovery algorithm to be currently performed among the one or more recovery algorithms based on a cell count value calculated according to a read operation corresponding to a previously performed recovery algorithm among the one or more recovery algorithms and the optimum read voltage information.

14. The storage device of claim 13, wherein the first memory cell is an on-cell or an off-cell.

15. The storage device of claim 13, wherein the memory controller controls the memory device to perform a read operation corresponding to a first recovery algorithm among the one or more recovery algorithms using a default read voltage.

16. The storage device of claim 15, wherein when the read operation using the default read voltage is failed, the memory controller controls the memory device to calculate a cell count value corresponding to the default read voltage based on a result of comparing a current sensed from the portion of the plurality of memory cells using the default read voltage with a reference current, and generate a first optimum read voltage based on the cell count value corresponding to the default read voltage and the optimum read voltage information.

17. The storage device of claim 16, wherein the memory controller controls the memory device to re-perform the read operation corresponding to the first recovery algorithm using the first optimum read voltage.

18. The storage device of claim 17, wherein when the read operation using the first optimum read voltage is failed, the memory controller controls the memory device to calculate a cell count value corresponding to the first optimum read voltage based on the result of comparing the current sensed from the portion of the plurality of memory cells using the first optimum read voltage with the reference current, and generate a second optimum read voltage based on the cell count value corresponding to the first optimum read voltage and the optimum read voltage information.

19. The storage device of claim 18, wherein the memory controller controls the memory device to perform a read operation corresponding to a second recovery algorithm among the one or more recovery algorithms using the second optimum read voltage.

20. The storage device of claim 19, wherein when the read operation using the second optimum read voltage is failed, the memory controller controls the memory device to generate a plurality of soft read voltages based on the second optimum read voltage and perform a third recovery algorithm among the one or more recovery algorithms using the plurality of soft read voltages.

21. A method of operating a memory device including a plurality of memory cells, the method comprising:
    storing optimum read voltage information determined according to a cell count value, which is the number of memory cells read as a first memory cell based on a portion of data read from a portion of the plurality of memory cells among the plurality of memory cells;
    receiving an optimum read voltage setting command from a memory controller;
    calculating a cell count value corresponding to a default read voltage based on the portion of data read from the portion of the plurality of memory cells using the default read voltage, in response to the optimum read voltage setting command; and
    generating a first optimum read voltage based on the cell count value corresponding to the default read voltage and the optimum read voltage information.

22. The method of claim 21, wherein the first memory cell is an on-cell or an off-cell.

* * * * *